(12) United States Patent
Bauer et al.

(10) Patent No.: US 8,127,712 B2
(45) Date of Patent: Mar. 6, 2012

(54) VACUUM COATING SYSTEM COMPRISING A TRANSPORT UNIT FOR TRANSPORTING SUBSTRATES

(75) Inventors: Reinhardt Bauer, Dresden (DE); Frank Hupka, Pirna (DE); Andreas Heisig, Dresden (DE); Johannes Struempfel, Dresden (DE); Hans-Christian Hecht, Weinboehla (DE); Wolfgang Erbkamm, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 504 days.

(21) Appl. No.: 12/280,931

(22) PCT Filed: Jul. 9, 2007

(86) PCT No.: PCT/EP2007/056990
§ 371 (c)(1),
(2), (4) Date: Nov. 10, 2008

(87) PCT Pub. No.: WO2008/003792
PCT Pub. Date: Jan. 10, 2008

(65) Prior Publication Data
US 2009/0173280 A1    Jul. 9, 2009

(30) Foreign Application Priority Data
Jul. 7, 2006 (DE) .......................... 10 2006 031 826

(51) Int. Cl.
*B65G 37/00* (2006.01)
*B65G 15/24* (2006.01)
*B05C 13/00* (2006.01)

(52) U.S. Cl. ........................................ 118/500; 118/729
(58) Field of Classification Search .................. 118/729, 118/500; *B65G 37/00, 15/24*
See application file for complete search history.

(56) References Cited

U.S. PATENT DOCUMENTS

| | | | | |
|---|---|---|---|---|
| RE25,215 E | * | 8/1962 | James | 198/502.4 |
| 3,901,381 A | * | 8/1975 | Quinn | 198/341.01 |
| 3,915,291 A | * | 10/1975 | Vogts | 198/626.1 |
| 3,931,882 A | * | 1/1976 | Ossbahr | 198/803.2 |
| 3,944,354 A | * | 3/1976 | Benwood et al. | 399/73 |

(Continued)

FOREIGN PATENT DOCUMENTS
WO    WO 9730343 A    8/1997

OTHER PUBLICATIONS
The International Search Report for PCT/EP2007/056990, filed Feb. 14, 2008.

*Primary Examiner* — Dah-Wei Yuan
*Assistant Examiner* — Stephen Kitt
(74) *Attorney, Agent, or Firm* — Heslin Rothenberg Farley & Mesiti P.C.

(57) ABSTRACT

A vacuum coating unit having a pair of side by side transport devices for transporting substrates in a transport direction. Each transport device includes at least one first endless conveyor running in the transport direction and having a conveying element guided around at least two guide rollers or pulleys. The conveying element is located at a distance from a guide device extending in the transport direction parallel to the conveying element in such a way that the ends of the substrates can be introduced into the gap between the conveying element and the guide device of the transport devices and can be moved in the transport direction by the displacement of the conveying elements.

17 Claims, 5 Drawing Sheets

U.S. PATENT DOCUMENTS

Figure 5:
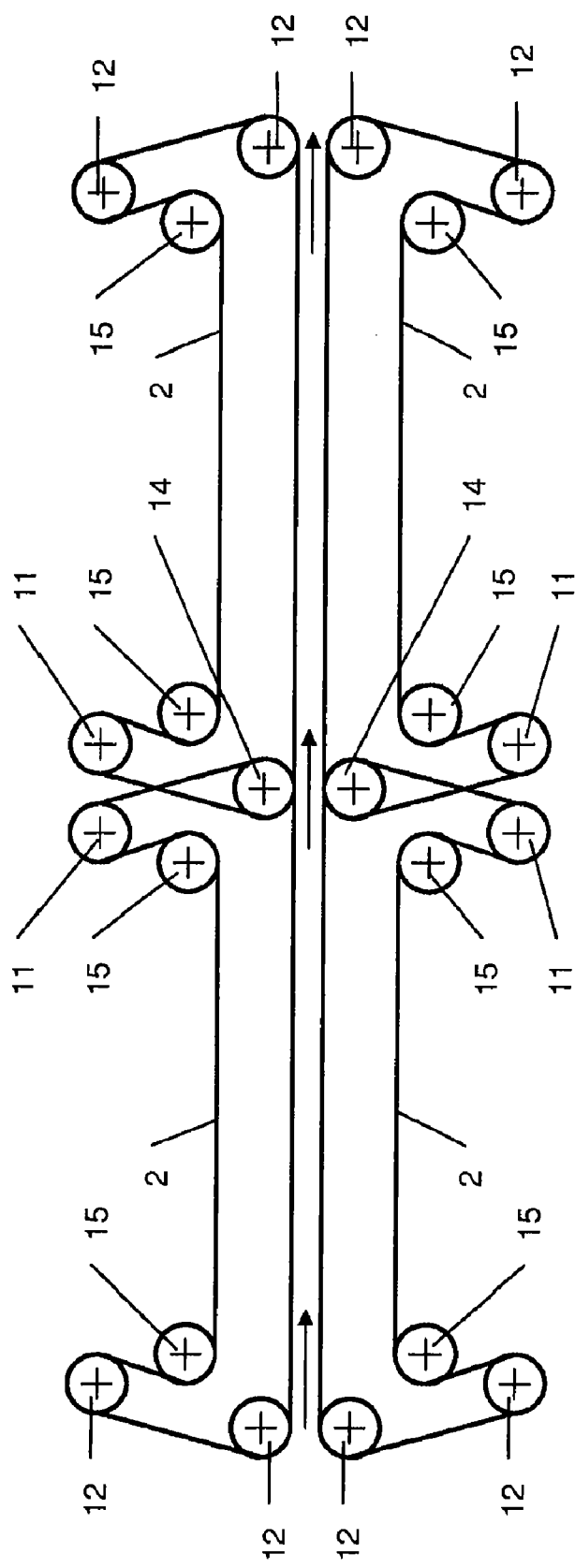

| | | | |
|---|---|---|---|
| 3,973,670 A * | 8/1976 | Spaar | 198/847 |
| 4,744,712 A | 5/1988 | Mitchell | |
| 5,138,972 A * | 8/1992 | Glanzmann | 118/699 |
| 5,585,730 A * | 12/1996 | Pazda et al. | 324/452 |
| 5,609,242 A * | 3/1997 | Hutchins et al. | 198/847 |
| 6,012,344 A * | 1/2000 | Halbo | 73/865.8 |
| 6,533,104 B1 * | 3/2003 | Starlinger-Huemer et al. | 198/626.1 |

\* cited by examiner

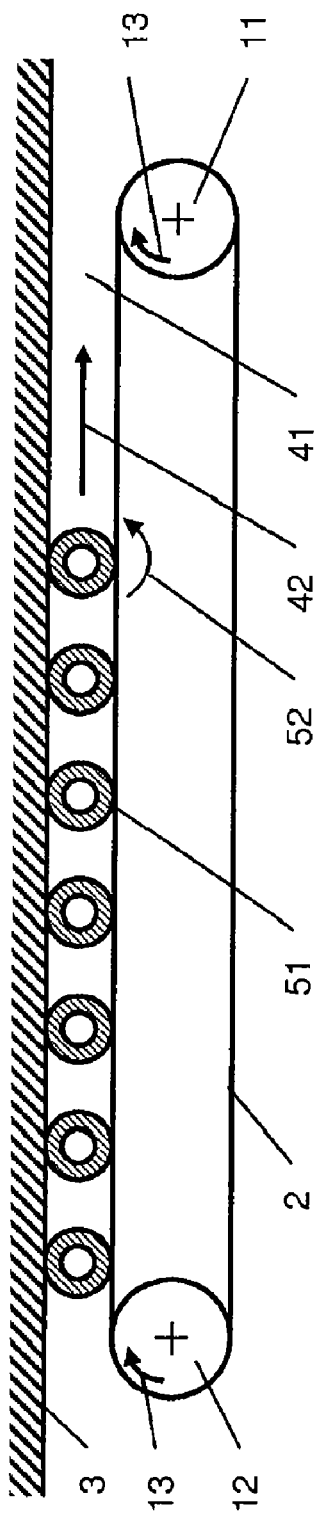
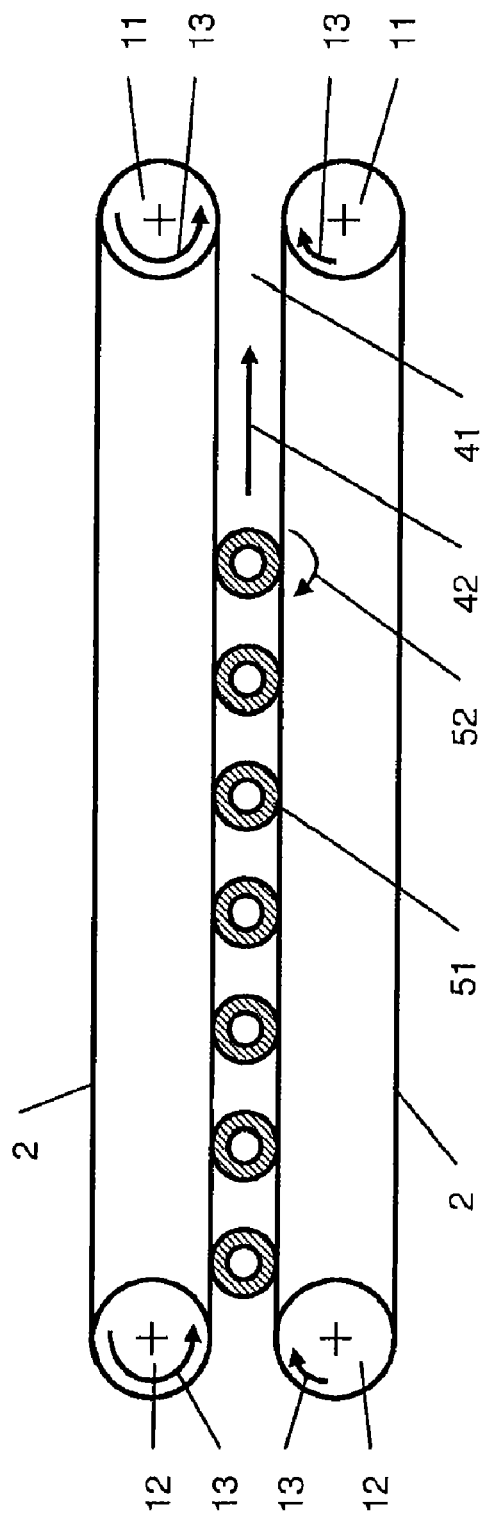

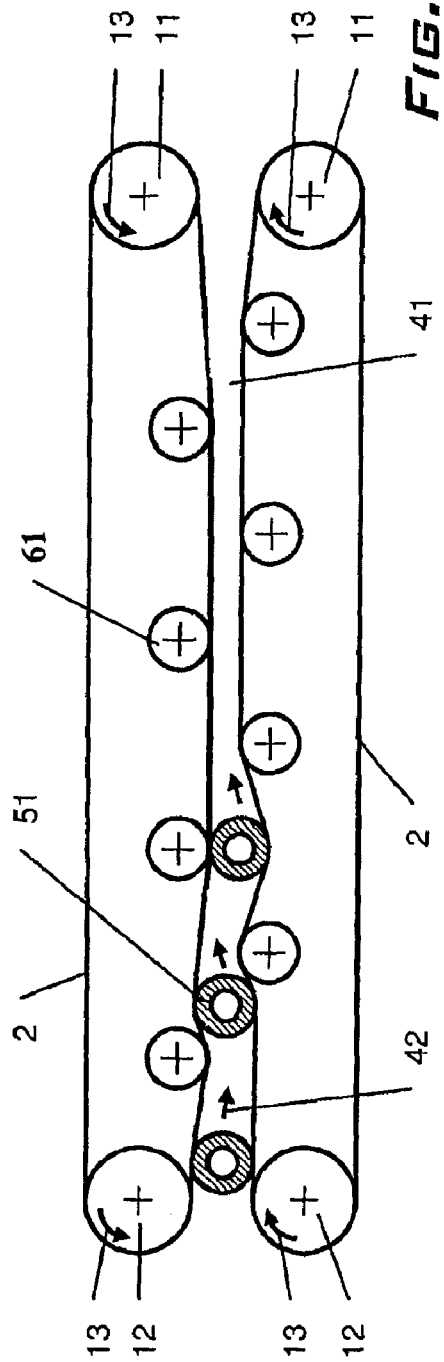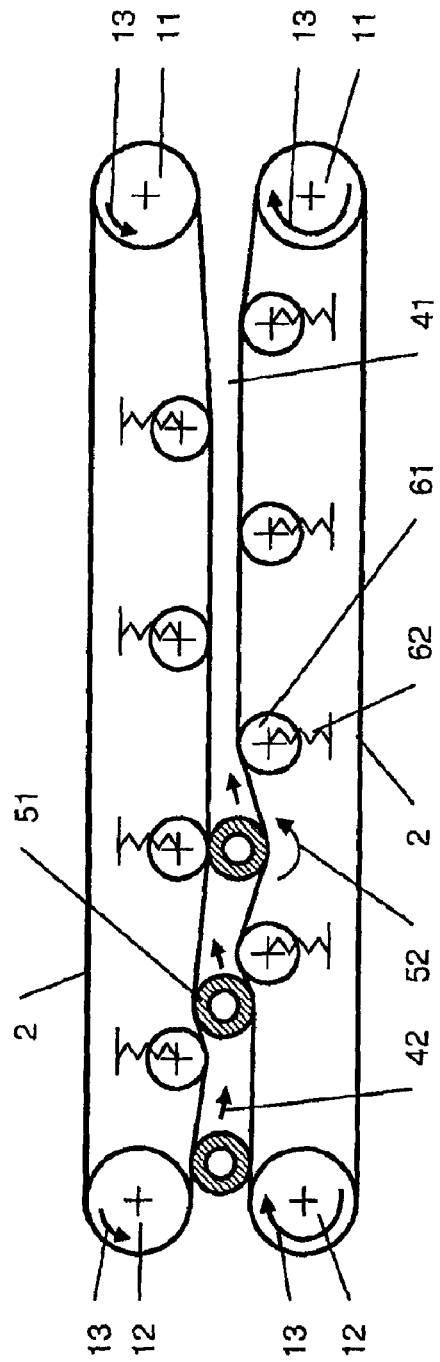

VACUUM COATING SYSTEM COMPRISING A TRANSPORT UNIT FOR TRANSPORTING SUBSTRATES

CROSS REFERENCE TO RELATED APPLICATIONS

This application is a national stage filing under section 371 of International Application No. PCT/EP2007/056990, filed on Jul. 9, 2007, and published in German on Jan. 10, 2008 as WO 2008/003792 and claims priority of German application No. 10 2006 031 826.9 filed on Jul. 7, 2006, the entire disclosure of these applications being hereby incorporated herein by reference

BACKGROUND ART

A vacuum coating unit with a transport device for transport of substrates in a transport direction is described below.

The described transport device is suitable for moving substrates through a vacuum coating unit in order to coat them, etch them or treat them in vacuum in some other way. Such vacuum coating units typically have lock chambers as well as a vacuum chamber arranged between the lock chambers, which can be divided into compartments with different functions, for example, pump compartments and process compartments.

During transport through the vacuum chamber, the substrates can be rotated in one embodiment of the described transport device around their own respective axis. In another embodiment, the rotation speed of the substrates can be chosen independently of the transport speed of the substrates in the transport direction. Several transport devices of the described type can be arranged one behind the other in the transport direction so that the substrates being transported are transferred without interruption from one transport device to the transport device arranged behind it. Transport devices of the described type can be arranged next to each other, viewed in the transport direction, so that elongated substrates, for example, tubes, can be brought into effective connection with each of the ends of the tubes connecting with one of the two transport devices.

Substrates can be fed in batches into the transport device. Conventional, temperature-sensitive bearings can be dispensed with so that the transport device can also be used for transport of substrates through high-temperature areas of a vacuum coating unit. In another embodiment defects of the transport device can be automatically recognized. An embodiment with substrate holders permits transport of different types of substrates without modification of the transport device.

BRIEF SUMMARY OF THE INVENTION

A vacuum coating unit with a transport device for transport of substrates in a transport direction includes at least one first endless conveyor arranged running in the transport direction with an endless conveying element guided around at least two guide pulleys, the endless conveying element is arranged with a spacing to a guide device running parallel to the conveying element of the first endless conveyor in the transport direction so that the substrates can be introduced into the spacing between the conveying element of the first endless conveyor and the guide device and moved by movement of the conveying element of the first endless conveyor in the transport direction.

Endless conveyor according to the present teaching is to be understood to mean a device that has an endless conveying element extending around at least two return pulleys. The conveying element of the endless conveyor can be an endless cable, for example, an endless belt with any cross section (circle, trapezoid, etc.), an endless belt (belt with a flat rectangular cross section) or an endless chain. The conveying element can be designed as a stainless steel cable for use in high-temperature areas of the vacuum coating unit. An endless conveyor of the mentioned type can include several conveying elements, for example, two endless stainless steel cables guided over the same guide pulleys. The stability of the endless conveyor can thus be increased, on the one hand, and its reliability improved, on the other hand, since the conveying element is designed redundant and on failure of one conveying element the second conveying element is still available.

In one embodiment, two of the described transport devices are arranged parallel and side-by-side, as viewed in the transport direction, in the vacuum chamber of a vacuum coating unit. The conveying elements of the endless conveyors of the two transport devices, in this variant, are each an endless steel cable and the guide devices are each a rail arranged parallel to the steel cable of the corresponding endless conveyor with a spacing between the rail and the cable. The distance between the steel cable and the rail being chosen so that the substrates being transported or the substrate holding devices provided to hold the substrates can be introduced in this spacing.

The substrates can be tubes to be coated. Each of these tubes is arranged transversely to the transport direction, specifically so that each end of a tube lies in the spacing between the steel cable and the rail of one of the two endless conveyors. In an illustrative embodiment, the distance between the two transport devices arranged side-by-side, i.e., their relative spacing transverse to the transport direction, is adjustable, making it possible to transport elongated substrates of different length through the vacuum chamber of the vacuum coating unit.

If the endless conveyors are put in operation, the sections of the steel cables of the two transport devices facing the rails are moved relative to the corresponding rails. Because of this cable movement, the two ends of the tubes that are clamped between a steel cable and a rail are caused to rotate so that the tube rolls on the two rails and in this way the tube is transported in the transport device through the vacuum coating unit. The tubular substrate is rotated around its longitudinal axis while, at the same time, being transported through the vacuum chamber so that uniform coating on all sides can be achieved. Instead of a rail or similar static guide device, the guide device of each transport device can also be a second endless conveyor arranged with a spacing to the first endless conveyor so that the transport device includes at least one pair of endless conveyors.

In one embodiment the distance between the conveying element and the guide device is adjustable so that the transport device can be adapted for use with different substrates. In another embodiment, substrate holding devices to accommodate the substrate are provided. Such substrate holding devices can have, for example, a first, conveyor-specific cylindrical end whose diameter is chosen so that it can be introduced into the spacing between the conveying element and the guide device, and a second substrate-specific end, configured so that it can be connected to a special substrate. For the case just mentioned, in which the substrates are tubes, the substrate-specific end could be cylindrical, the diameter being chosen so that it corresponds to the inside diameter of the tube. The substrate-specific end could also be noncylindrical, for example, have a square cross section or be provided with a clamping device.

Another embodiment provides that the guide device is also an endless conveyor so that each transport device includes at least one pair of endless conveyors. In this case, a first endless conveyor and a second endless conveyor are arranged running parallel to each other at a spacing in which the spacing between them corresponds to the diameter of the substrates being transported or to the conveyor-specific cylindrical end of a substrate holding device or in which the spacing between the first endless conveyor and the second endless conveyor of a transport device is adjustable. It can also be provided that the two first and second endless conveyors arranged at a spacing to each other of a transport device be controllable independently of each other. Through this embodiment, the rotational speed of the substrate can be chosen independently of the translatory transport speed through the vacuum chamber.

For example, depending on the speed difference of the two endless conveyors it is possible to have the substrates rotate forward or backward. In the same manner, it is possible in this embodiment to transport the substrates without rotation by operating the two endless conveyors at the same speed. It is also possible to cause the substrates to rotate without moving them in the transport direction. Moreover, the ratio of rotatory and translatory movement of the substrates along the transport path can be dynamically varied, by driving the first and second endless conveyors of a transport device accordingly.

For example, it is therefore possible to move substrates through the lock areas or so-called pump compartments that serve to maintain the process vacuum and vacuum separation between adjacent process compartments in purely translatory fashion, i.e., without a rotatory component, while the substrates are moved in the process compartment stationary with purely rotatory movement, i.e., without a translatory component in order to achieve uniform coating on all sides. By arranging several equivalent transport devices one behind the other, it is possible to temporarily store subsequent substrates by stopping a first transport device in a buffer zone, while the substrates situated ahead in a second transport device are coated in a process compartment, etched or treated in some other way. After completion of treatment, the substrates can be removed from the process compartment and the following substrates moved from the buffer zone and into the process compartment.

It can also be provided that the conveying elements of the two endless conveyors or transport device are deflected at several sites so that the substrates on their path through the vacuum chamber are moved up and down along the transport device. With this embodiment, good frictional engagement between the conveying elements and the substrates is ensured over the entire length of the endless conveyors. Deflection of the conveying elements can be produced, for example, by firmly arranged or elastically mounted pressure rollers, which are arranged along the transport direction in alternating arrangement so that they deflect the conveying element of an endless conveyor in a direction toward the conveying element of the other endless conveyor. Because of this the conveying elements of the two endless conveyors of a transport device initially run with a spacing that is less than the diameter of the substrates or the substrate holding devices. If the substrate or the substrate holding devices are introduced into the spacing and transported between the two conveying elements, the distance between the two conveying elements is widened by the substrate or substrate holding devices to the necessary spacing. The pressure rollers arranged on both sides in alternation force a deflection of the substrate or substrate holding device so that the substrate or receiving device is moved back and forth, across the transport direction, in alternation during movement along the transport direction.

In the example just described, in which two pairs of endless conveyors are arranged so that one end of a substrate can be introduced into the spacing of each pair of endless conveyors of the transport device, this embodiment produces an improvement in frictional engagement between the substrate and the two conveying elements and at the same time alternating up and down movement of the substrate during transport through the vacuum chamber along the transport device.

When two or more transport devices are arranged one behind the other in the transport direction, it can be provided that the conveying elements of adjacent endless conveyors overlap so that one guide pulley of each of the two endless conveyors are mounted to rotate so that they have a common axis of rotation. In a modification, a common guide pulley can be provided, designed so that it simultaneously acts as guide pulley for two endless conveyors. Substrates can thus be transferred from a first transport device to a second transport device arranged behind it.

To recognize emergencies, a monitoring device can be arranged on at least one guide pulley. Such a monitoring device can include two contact elements, one of which is mounted on the guide pulley. The other contact element is fixedly arranged in the vicinity of the guide pulley so that during each revolution of the guide pulley contact between the two contact elements occurs. As soon as the guide pulley no longer rotates, for example, because the conveying element is torn, the absence of contact between the two contact elements can be recognized.

In another embodiment, a transport cart, having a number of receptacles, is provided to accommodate the substrates. Such a transport cart can have a frame, for example, in which upward open recesses are provided in two opposite cross arms of the frame at uniform spacings, in which one end of a substrate or substrate holding device can be inserted. The transport cart can have wheels in order to facilitate its transport through the vacuum chamber. The transport cart can also have its own drive device.

The transport cart can be designed so that the substrate receptacles are arranged at the same height level as the spacing between the conveying element and the guide device of a transport device arranged in the interior of the vacuum chamber of the vacuum coating unit. Because of this arrangement, the substrates or the substrate holding devices can be introduced without additional expedients into the spacing between the conveying element and the guide device, and, in this way, brought into effective connection with the transport device when the transport cart equipped with the substrates is introduced into the vacuum chamber.

The transport cart can be moved in the transport direction by the translatory movement produced by the transport device on the substrates or substrate holding devices received in the substrate receptacles of the transport cart. When the transport cart has its own drive device, this drive device can be operated so that the transport cart is moved by the action of the drive device synchronously with the movement of the substrates in the transport device through the vacuum chamber.

BRIEF DESCRIPTION OF DRAWING FIGURES

Figure 6:
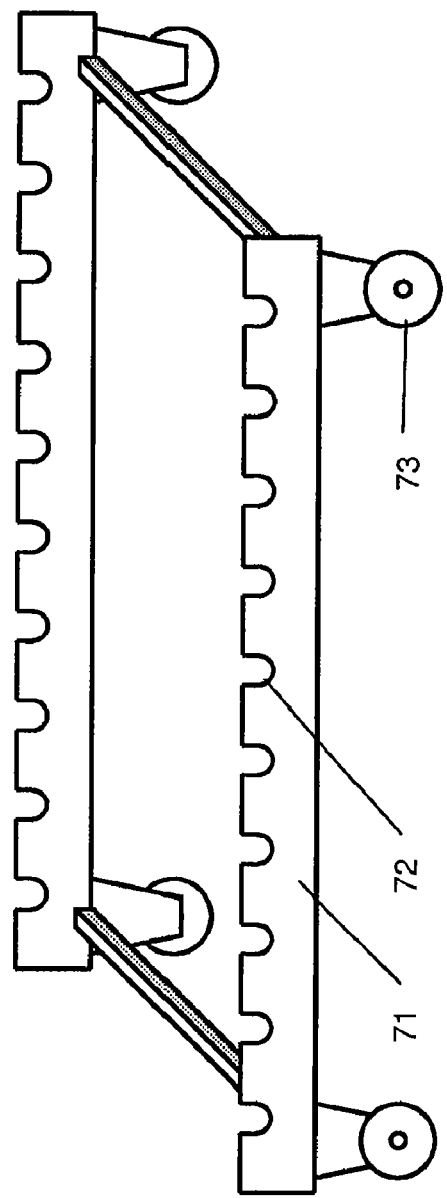
Figure 7:
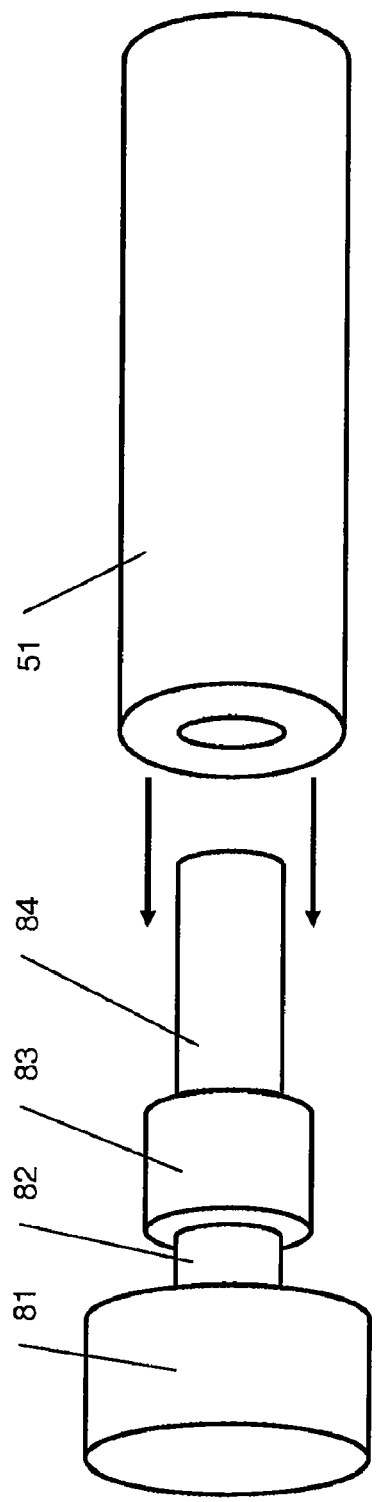
Figure 8:
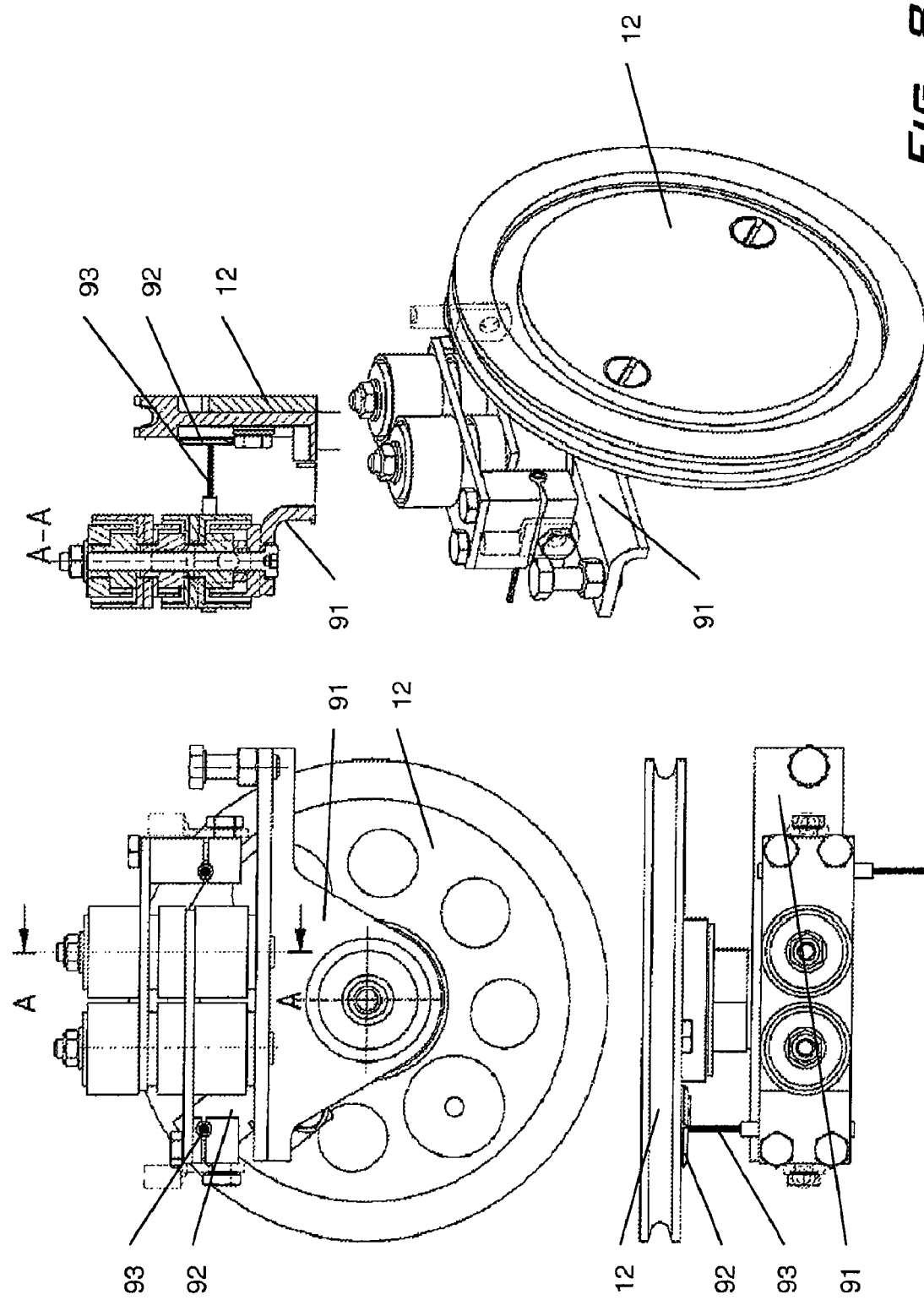

The described transport device is further explained below by means of practical examples and corresponding drawings. In the drawings FIG. 1 shows a transport device with a static guide device, FIG. 2 shows a transport device with two endless conveyors, FIG. 3 shows a transport device with rigidly mounted pressure rollers, FIG. 4 shows a transport device with elastically mounted pressure rollers, FIG. 5 shows two transport devices arranged one behind the other in the transport direction, FIG. 6 shows a transport cart, FIG. 7 shows a substrate holding device for a tubular substrate, and FIG. 8 shows a monitoring device.

DETAILED DESCRIPTION

The practical example in FIG. 1 is a transport device with an endless conveyor and a static guide device arranged at a spacing 41 to it. The endless conveyor includes two guide pulleys 11, 12, one guide pulley of which is a drivable drive roller 11, as well as a conveying element 2 in the form of an endless stainless steel cable. The static guide device is a rail 3 fixedly installed within the vacuum chamber of the vacuum coating unit. In this practical example, tubular substrates 51, which are arranged transversely to the transport direction 42, are transported through the vacuum chamber. For this purpose, the tubular substrates 51 are initially introduced into the spacing 41 between the stainless steel cable 2 and rail 3.

The spacing 41 is chosen so that the tubular substrates 51 are securely held between the stainless steel cable 2 and the rail 3. The drivable guide pulley 11 is driven in the direction of rotation shown by arrow 13. Because of the coupling between the two guide pulleys 11, 12 caused by the stainless steel cable 2, the second guide pulley 12 is also rotated in the direction of rotation shown by arrow 13. Because of friction between the stainless steel cable 2 and the tubular substrates 51, the substrates are rotated in the direction of rotation shown by arrow 52. The tubular substrates 51 therefore roll on rail 3 so that they are moved in a linear movement through the vacuum chamber in the transport direction 42.

As shown in FIG. 2, the transport device with a first endless conveyor has a second endless conveyor arranged parallel to the first endless conveyor with a spacing 41 therebetween, which acts as a guide device. Both endless conveyors include two guide pulleys 11, 12, one guide pulley 11 of which is drivable. The driven guide pulleys 11 of the two endless conveyors are controllable separately, independent of each other. In the illustrated example, the upper endless conveyor is driven more quickly than the lower endless conveyor, as indicated by the arrows 13 of different length, which show the direction of rotation at rotational speed of the guide pulleys 11, 12.

The tubular substrates 51 arranged between the two endless conveyors are moved by the movements of conveying element 2 of both endless conveyors in the transport direction indicated by arrow 42. At the same time, the tubular substrates 51 because of the speed difference between the two endless conveyors are placed in rotation indicated by arrow 52. If the upper endless conveyor would be driven more slowly than the lower endless conveyor, the tubular substrates 51 would rotate in the opposite direction of rotation. In the practical example, both endless conveyors are driven so that the part of the corresponding conveying element 2 in contact with the tubular substrates 51 is moved in the transport direction 42. However, it should be mentioned that operational types are also possible in which one of the endless conveyors is driven in the opposite direction. The substrates 51 are moved in the transport direction 42 as long as the speed of this endless conveyor is lower than the speed of the other endless conveyor.

In the transport device illustrated in FIG. 3, two endless conveyors are arranged with a spacing 41 between them, which corresponds to the diameter of the tubular substrates 51. The spacing between the conveying elements 2 between the guide pulleys 11, 12 of the endless conveyors is reduced by several pressure rollers 61 which are installed fixed, i.e., rigidly. The pressure rollers 61 are arranged in alternation on the conveying elements 2 of both endless conveyors so that the substrates 51 are moved upward and downward during movement through the gap 41 existing between conveying elements 2 when they pass by the pressure roller 61.

The frictional engagement of the tubular substrates 51 with the two conveying elements 2 is reinforced by the pressure roller 61 and the reduced spacing 41 of the two conveying elements 2 relative to each other. The rotational speed indicated by arrow 13 of the guide pulleys 11, 12 is equally large in the endless conveyors so that the tubular substrates 51 are not placed in rotation. In order to keep the tension of the conveying elements 2 of both endless conveyors constant, it is useful in this practical example to mount at least one of the guide pulleys 11, 12 of each endless conveyor elastically.

The practical example in FIG. 4 differs from the one just described in that the pressure rollers 61 are elastically mounted on spring 62 so that the tension of the conveying elements 2 of both endless conveyors is kept constant. The rotational speed of guide pulleys 11, 12 of both endless conveyors indicated by arrows 13 is different so that the tubular substrates 51 are placed in rotation as indicated by arrow 52.

Two equivalent transport devices are arranged one behind the other in FIG. 5. Each transport device again consists of an upper and lower endless conveyor. The areas of effect of the endless conveyors arranged one behind the other overlap in the area of the transition between them. For this purpose the conveying elements 2 of the consecutive endless conveyors are passed over a common guide pulley 14. As an alternative, separate guide pulleys could be provided in this area. The separate guide pulleys, however, could have a common axis of rotation. The separate guide pulleys could thus be mounted on the same axle.

The conveying element 2 of each endless conveyor in the practical example of FIG. 5 is passed over a total of six guide pulleys, two guide pulleys 12 ensuring that contact of the conveying element with the tubular substrates 51 or substrate holding devices for substrates 51 is produced, one guide pulley of which is a common guide pulley 14 above the endless conveyors, two tension rollers 15 to maintain the tension in the conveying element and two other guide pulleys 11, 12, one guide pulley 11 of which is drivable, which are responsible for reversal of the conveying element 2.

A transport cart is shown in FIG. 6 which is designed to accommodate a number of substrates 51. For this purpose, the transport cart has a frame with two longitudinal cross arms 71, each of which is provided with a number of substrate receptacles 72 which are designed as upward open recesses. The recesses 72 are designed so that substrate holding devices can be inserted into the recesses 72 to receive elongated substrates 51. Additional supports for the substrate holding devices are not provided.

The transport cart may have four wheels 73. The transport cart can be equipped outside of the vacuum coating unit with the substrates 51 to be treated in the vacuum and then introduced to the interior of the vacuum chamber through a lock. For this purpose, ten elongated substrates 51 are either directly inserted with each end into one of two oppositely arranged substrate receptacles 72 corresponding to the number of substrates receptacles 72 arranged in pairs or connected on each end to a substrate holding device and then inserted into the transport cart so that each substrate holding device is supported on a substrate receptacle 72.

A receiving device suitable for this purpose is shown as an example in FIG. 7. In the illustrated example, the substrate holding device is a rotationally symmetric part having several sections. The conveyor-specific end 81 is cylindrical and provided to extend beyond the longitudinal cross arm 71 of a transport cart and to enter into effective connection with the conveying element 2 of an endless conveyor and a guide device. The substrate-specific end 84 is also cylindrical and designed to be inserted into the end of a tubular substrate 51.

Between the conveyor-specific end 81 and the substrate-specific end 84 there is a support section 82 with which the substrate holding device can be inserted into the substrate receptacle 72 of the transport cart. Between the support section 82 and the substrate-specific end 84, a stop 83 is arranged, which bounds the support section 82 on the one side and ensures a defined spacing between the end of the tubular substrate 51 and the support section 82, on the other side.

FIG. 8 shows a monitoring device for recognition of defects of an endless conveyor. A guide pulley 12 is mounted to rotate on a bearing block 91. The guide pulley 12 has a first contact element 92 on its side facing bearing block 91, which in the illustrated example is a spring steel sheet mounted on guide pulley 12. Electrically insulated from the bearing block 91 and therefore from the guide pulley 12, a second contact element 93 is fixed on the bearing block 91. The second contact element 93 is designed as a flexible steel pin in the illustrated example. The flexibility is achieved by the fact that this steel pin 93 is a piece of stainless steel cable pressed into a mount.

When the endless conveyor is placed in operation, the guide pulley 12 begins to rotate. During each revolution the spring steel plate 92 passes by the flexible steel pin 93 once. Contact between the spring steel plate 92 and the flexible steel pin 93 then occurs. In this way, the two contact elements 92, 93 form a simple mechanical switch which closes a circuit on contact of the contact elements 92, 93. If no switching process is recorded, despite the endless conveyor being engaged, this means that the guide pulley 12 is no longer rotating, from which it can be concluded that the conveying element 2 of the endless conveyor is defective. The described monitoring device is robust, can withstand high surrounding temperatures and is insensitive to possibly undesired coating of the contact elements 92, 93, since these automatically mutually clean each other on each revolution.

The invention claimed is:

1. A Transport unit, comprising: first and second transport devices disposed side by side for transport of elongate substrates in a transport direction, each transport device comprising at least one first endless conveyor arranged running in the transport direction, each at least one first endless conveyor including an endless conveying element guided around at least two guide pulleys, each conveying element being arranged with a vertical spacing to a respective guide device, the guide device being vertically aligned with and arranged parallel to the conveying element in the transport direction, the transport devices being arranged so that the conveying element of the at least one first endless conveyor of each transport device frictionally contacts a different end of the elongate substrates or substrate holding devices disposed at opposite ends of the elongate substrates, and wherein the ends of the elongate substrates or the substrate holding devices are introduced into the spacing between the conveying element and the respective guide device of each transport device and are moved by movement of the conveying element of the at least one first endless conveyor of the transport devices in the transport direction, and the transport devices engage only the ends of the elongate substrates.

2. The transport unit according to claim 1, wherein the guide device spaced from the conveying element of the at least one first endless conveyor comprises a second endless conveyor.

3. The transport unit according to claim 2, wherein the first endless conveyor and the second endless conveyor are controlled independently of each other.

4. The transport unit according to claim 2, wherein at least one conveying element of the at least one first endless conveyor and the second endless conveyors comprises at least one endless steel cable.

5. The transport unit according to claim 2, wherein at least one conveying element of the at least one first and the second endless conveyors includes at least two equivalent endless steel cables.

6. The transport unit according to claim 1, wherein the conveying element includes at least one endless belt.

7. The transport unit according to claim 2, wherein at least one of the conveying element of the at least one first endless conveyor and a conveying element of the second endless conveyor is deflected laterally to the transport direction.

8. The transport unit according to claim 1, wherein a rear endless conveyor is arranged behind the at least one first endless conveyor in the transport direction, a rear guide pulley of the at least one first endless conveyor and a front guide pulley of the rear endless conveyor having a common axis of rotation.

9. The transport unit according to claim 8, wherein the rear guide pulley of the at least one first endless conveyor is simultaneously the front guide pulley of the rear endless conveyor.

10. The transport unit according to claim 1, wherein a monitoring device to monitor pulley movement is provided on at least one pulley of the guide pulleys.

11. The transport unit according to claim 10, wherein the monitoring device includes a first contact element arranged on the at least one guide pulley and a second contact element arranged next to the at least one guide pulley, the first and second contact elements being arranged relative to each other so that during each revolution of the at least one guide pulley contact between the first contact element and the second contact element occurs.

12. The transport unit according to claim 1, further comprising a transport cart to receive the elongate substrates, said cart having a number of opposed receptacles for receiving respective ends of the elongate substrates or the substrate holding devices disposed at the opposite ends of the elongate substrates, and said cart introducing the substrates into frictional contact with the conveying element of the endless conveyors.

13. The transport unit according to claim 12, wherein at least one of the receptacles comprises an upward open recess arranged in a longitudinal cross arm of the transport cart.

14. The transport unit according to claim 12, wherein at least one of the receptacles comprises a slot arranged in a longitudinal cross arm of the transport cart.

15. The transport unit according to claim 12, further comprising at least one substrate holding device having one end adapted to hold a substrate and another end insertable into a receptacle of the transport cart.

16. The transport unit according to claim 15, wherein the at least one substrate holding device has a support section for insertion into a the receptacle.

17. The transport unit according to claim 12, wherein the transport cart is driven and controlled independently of the endless conveyors.

* * * * *